United States Patent
Miry

(10) Patent No.: US 10,502,596 B2
(45) Date of Patent: Dec. 10, 2019

(54) ELECTRONIC MEASUREMENT DEVICE CAPABLE OF DISPLAYING DATA IN THE FORM OF TWO DIMENSIONAL MATRIX CODE, ELECTRONIC READER, ELECTRONIC INSTALLATION AND TRANSMISSION METHOD ASSOCIATED THEREWITH

(71) Applicant: Schneider Electric Industries SAS, Rueil-Malmaison (FR)

(72) Inventor: Jean-Marc Miry, Saint Ismier (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 671 days.

(21) Appl. No.: 14/615,847

(22) Filed: Feb. 6, 2015

(65) Prior Publication Data

US 2015/0226587 A1    Aug. 13, 2015

(30) Foreign Application Priority Data

Feb. 12, 2014    (FR) ...................................... 14 51084

(51) Int. Cl.
*G01D 21/00* (2006.01)
*G01R 29/00* (2006.01)
(Continued)

(52) U.S. Cl.
CPC ............. *G01D 21/00* (2013.01); *G01D 4/002* (2013.01); *G01D 5/39* (2013.01); *G01K 17/00* (2013.01);
(Continued)

(58) Field of Classification Search
CPC .......... G01D 7/00; G01D 21/00; G01D 4/002; G01D 5/39; G01R 29/00; G01K 17/00;
(Continued)

(56) References Cited

U.S. PATENT DOCUMENTS

| 7,886,975 B2 | 2/2011 | Matsuo et al. |
| 2001/0012413 A1 | 8/2001 | Longacre, Jr. et al. |

(Continued)

FOREIGN PATENT DOCUMENTS

| CN | 101258515 A | 9/2008 |
| CN | 101911046 A | 12/2010 |

(Continued)

OTHER PUBLICATIONS

French Preliminary Search Report dated Jul. 25, 2014 in French Application 14 51084, filed on Feb. 12, 2014 ( with English Translation of Categories of Cited Documents).

(Continued)

*Primary Examiner* — Shahed Ahmed
(74) *Attorney, Agent, or Firm* — Oblon, McClelland, Maier & Neustadt, L.L.P.

(57) ABSTRACT

This electronic device is suitable for measuring a quantity. This measurement device comprises:
- a unit for measuring the quantity, able to deliver measurement data,
- an encoding unit, able to convert measurement data into structured data according to a structuration format, the data structured according to the structuration format including at least one portion of the measurement data,
- a unit for generating at least one two-dimensional matrix code are from the structured data, and
- a display unit, able to display each generated matrix code.

The structured data further comprise a first identifier of the structuration format, said first identifier being able to identify in a unique way the structuration format.

17 Claims, 3 Drawing Sheets

(51) Int. Cl.
*G01K 17/00* (2006.01)
*G01D 5/39* (2006.01)
*G01D 4/00* (2006.01)
*G06K 19/06* (2006.01)

(52) U.S. Cl.
CPC ....... *G01R 29/00* (2013.01); *G06K 19/06037* (2013.01); *G06K 19/06093* (2013.01); *G06K 19/06112* (2013.01); *Y02B 90/241* (2013.01); *Y04S 20/32* (2013.01)

(58) Field of Classification Search
CPC ........ G06K 19/06009; G06K 19/06112; Y02B 90/241; Y04S 20/32
USPC ................... 702/32, 45, 47, 53, 57, 64, 133
See application file for complete search history.

(56) References Cited

U.S. PATENT DOCUMENTS

| | | | |
|---|---|---|---|
| 2006/0071077 A1* | 4/2006 | Suomela | G06K 7/1095 235/462.01 |
| 2011/0303754 A1 | 12/2011 | Shinotani et al. | |
| 2012/0154172 A1* | 6/2012 | O'Hara | H04Q 9/00 340/870.02 |
| 2013/0201316 A1* | 8/2013 | Binder | H04L 67/12 348/77 |
| 2013/0345623 A1 | 12/2013 | Kopperschmidt et al. | |

FOREIGN PATENT DOCUMENTS

| | | |
|---|---|---|
| EP | 0 910 032 A2 | 4/1999 |
| EP | 0 910 032 A3 | 4/1999 |
| EP | 2 088 706 A2 | 8/2009 |
| EP | 2 088 706 A3 | 3/2010 |
| WO | WO 2009/091488 A2 | 7/2009 |
| WO | WO 2013/046231 A1 | 4/2013 |

OTHER PUBLICATIONS

"QR Code® Essentials", DENSO ADC, Inventor of the QR Code, XP055104966, 2011, 12 pages.
Search Report dated Jun. 3, 2015 in European Application No. EP 15 15 3736.

* cited by examiner

ELECTRONIC MEASUREMENT DEVICE CAPABLE OF DISPLAYING DATA IN THE FORM OF TWO DIMENSIONAL MATRIX CODE, ELECTRONIC READER, ELECTRONIC INSTALLATION AND TRANSMISSION METHOD ASSOCIATED THEREWITH

BACKGROUND OF THE INVENTION

The present invention relates to an electronic device for measuring a quantity such as an electric quantity or a thermodynamic quantity. The measurement device comprises a unit for measuring the quantity, able to deliver measurement data, and an encoding unit able to convert the measurement data into structured data according to a structuration format, the data structured according to the structuration format including at least one portion of the measurement data. The measurement device comprises a unit for generating at least one two-dimensional matrix code from the structured data, and a display unit able to display each generated matrix code.

The invention also relates to an electronic reader able to read a two-dimensional matrix code displayed by such an electronic device.

The invention also relates to an electronic installation for measuring said quantity comprising such an electronic device and such an electronic reader.

The invention also relates to a method for transmitting measurement data of said quantity between such an electronic device and such an electronic reader.

From document WO 2013/046231 A1, a measurement sensor is known, able to display measured data dynamically and in the form of two-dimensional matrix codes, such as QR (Quick Response) codes. The matrix codes are successively displayed over time. Each matrix code represents a frame of measured data according to a predetermined structuration format. This document also describes a reader of QR matrix codes, able to read the matrix codes displayed by the sensor and able to extract from said QR codes read the measured data represented according to the structuration format. The predetermined structuration format of the data, represented by the matrix codes, is also known to the reader. It is then able to extract the frames of measured data from the read matrix codes and according to this format.

However there exists a large number of formats for structuration of data, these formats for example depending on the type of sensor, on the measured quantity and/or on the measurement standards used. The use of such a measurement sensor is therefore relatively complex, and requires a specific reader.

SUMMARY OF THE INVENTION

The object of the invention is to propose a measurement device able to display measurement data in the form of a two-dimensional matrix code, which is easier to use and with a larger number of compatible matrix code readers.

For this purpose, the object of the invention is a measurement device of the aforementioned type, wherein the structured data further comprise a first identifier of the structuration, said first identifier being able to exclusively identify the structuration format.

According to other advantageous aspects of the invention, the measurement device comprises one or several of the following features, taken individually or according to all the technically possible combinations:

the measurement data include successive first frames of data and the coding unit is able to convert each first frame of measurement data into a corresponding second frame of structured data, each second frame including a second identifier of said frame from among the plurality of second frames;

the structuration format is defined by a descriptor in the form of a file in the XML or JSON format; and the structured data consist of alphanumeric characters.

The object of the invention is also an electronic reader, comprising a unit for reading a two-dimensional matrix code, the two-dimensional matrix code being able to be displayed by a device as defined above, the reading unit being further suitable for determining the structured data corresponding to the read matrix code, wherein the electronic reader further comprises a decoding unit able to determine, depending on the first identifier, the measurement data contained in the structured data.

According to other advantageous aspects of the invention, the electronic reader comprises one or several of the following features, taken individually or according to all the technically possible combinations:

the decoding unit is able to retrieve a descriptor of the structuration format corresponding to the first identifier of the structuration format, and able to use said descriptor for determining the measurement data contained in the structured data;

the decoding unit is able to retrieve the descriptor of the structuration format from a computer server via the Internet network;

the decoding unit is able to transmit to an electronic apparatus external to the reader, the measurement data contained in the structured data and the descriptor of the format corresponding to the first identifier.

The object of the invention is also an electronic installation for measuring a quantity, such as an electric quantity or a thermodynamic quantity, wherein the installation comprises an electronic device as defined above and an electronic reader as defined above.

The object of the invention is also a method for transmitting measurement data of a quantity, such as an electric quantity or a thermodynamic quantity, and between an electronic device for measuring the quantity and an electronic reader, the method comprising the following steps:
a step for encoding the measurement data during which the measurement data are converted by the device into structured data according to a structuration format, the structured data according to the structuration format including at least one portion of the measurement data,
a step for generating by the device at least one two-dimensional matrix code from the structured data,
a step for displaying by the device each generated matrix code,
a step for reading by the reader the displayed matrix code(s), and
a step for determining by the reader the measurement data contained in the structured data,
wherein the structured data comprise a first identifier of the structuration format, the first identifier being able to exclusively identify the structuration format, and said first identifier is used during the determination step.

According to another advantageous aspect of the invention, the data transmission method comprises the following feature:

during the determination step, the reader retrieves a descriptor of the structuration format corresponding to the first identifier, and uses said descriptor for determining the measurement data contained in the structured data.

BRIEF DESCRIPTION OF THE DRAWINGS

These features and advantages of the invention will become apparent upon reading the following description, only given as a non-limiting example, and made with reference to the appended drawings, wherein.

DETAILED DESCRIPTION OF PREFERRED EMBODIMENTS

Figure 1:
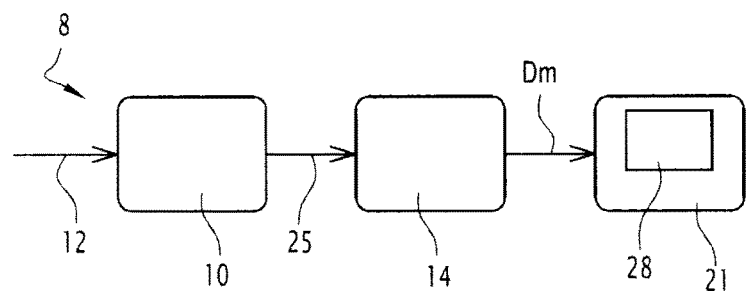
FIG. 1 is a schematic illustration of an electronic installation according to the invention, the installation comprising an electronic measurement device, able to display measurement data as a two-dimensional matrix code and an electronic reader of the matrix code(s) displayed by the measurement device.

In FIG. 1, an electronic installation 8 comprises a device 10 for measuring a quantity 12, such as an electric quantity or a thermodynamic quantity, and an electronic reader 14 coupled with the measurement device 10 in order to read data relating to the measured quantity 12.

Figure 2:
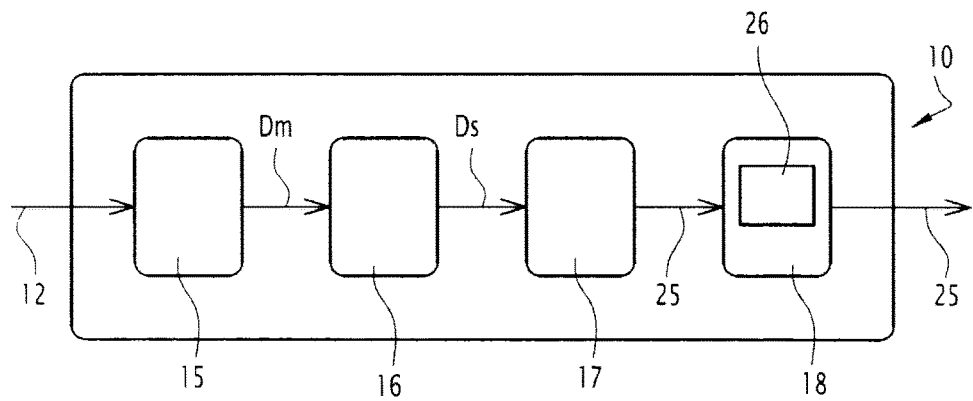
FIG. 2 is a schematic illustration of the measurement device of FIG. 1.

The measurement device 10 comprises a unit 15 for measuring the quantity 12, an encoding unit 16, a unit 17 for generating an image corresponding to the measured quantity, and a unit 18 for displaying said image, as illustrated in FIG. 2.

Figure 3:
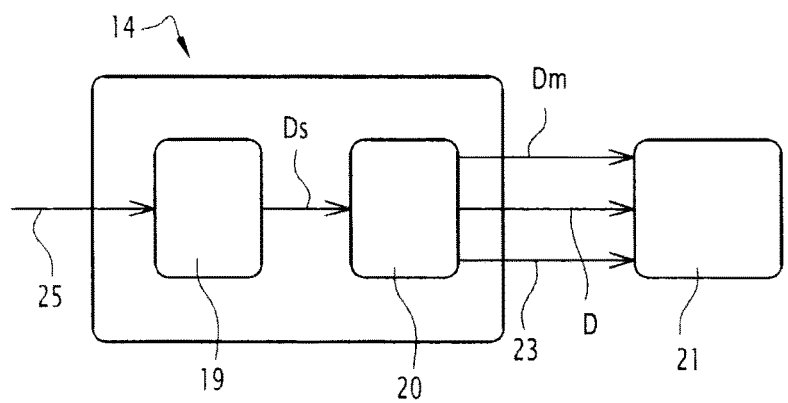
FIG. 3 is a schematic illustration of the electronic reader of FIG. 1.

The electronic reader 14 comprises a unit 19 for reading said or each image displayed by the measurement device and a decoding unit 20, as illustrated in FIG. 3.

Additionally, the electronic reader 14 is connected to a remote electronic apparatus 21, and is able to transmit information from the decoding unit 20 to this electronic apparatus 21.

The measurement unit 15, visible in FIG. 2, is for example an amperemeter measuring a current flowing in an electric line, a voltmeter measuring the voltage of an electric conductor, or further a thermometer measuring a temperature in a room. The unit 15 is able to measure the quantity 12 at successive measurements instants Tm, preferably with a predetermined periodicity.

The measurement unit 15 is able to deliver measurement data Dm corresponding to the values successively assumed by the quantity 12. The measurement unit 15 is for example able to deliver at each measurement instant Tm a first frame of data representative of the value of the quantity 12 for this measurement instant Tm. The measurement data Dm then include a succession of first frames of data, i.e. a sequence of first frames of data.

The measurement unit 15 is able to transmit the measurement data Dm to the encoding unit 16 with view to their conversion into structured data Ds, the first frames of data for example being successively transmitted to the encoding unit 16, or else sequence by sequence.

The encoding unit 16 is able to convert the measurement data Dm into the structured data Ds according to the structuration format F. This conversion is for example carried out frame by frame, or else in sequence by sequence, and the first frames of data are then converted into second frames of corresponding structured data.

Each first frame of data and each second frame of data are for example of a predetermined length. In other words, each first frame of data and each second frame of data consists of a predetermined number of bytes.

Alternatively, each first data frame and each second data frame are of variable length. In other words, each first data frame and each second data frame include a variable number of bytes.

The measurement data Dm are for example expressed as a chain of alphanumerical characters, preferably as a decimal numbers. The structured data Ds are for example expressed as a chain of alphanumerical characters, for example as decimal or hexadecimal numbers. The structured data Ds preferably consist of alphanumerical characters.

Figure 4:
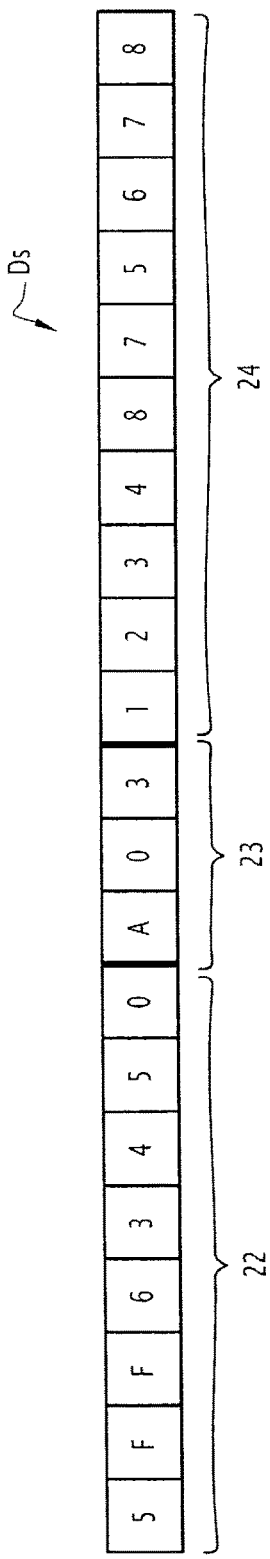
FIG. 4 is a schematic illustration of a frame of structured data.

Each of the second frames of structured data Ds comprise a first identifier 22 of the structuration format F, a second identifier 23 of the second corresponding frame from among the plurality of second frames of structured data Ds and a field of formatted data 24, as illustrated in FIG. 4.

Each second frame of structured data Ds preferably consists of the first identifier 22, of the second identifier 23 and of the field of formatted data 24.

The encoding unit 16, visible in FIG. 2, is able to transmit one after the other the second frames of structured data Ds to the display unit 18.

The generation unit 17 is able to generate at least one two-dimensional matrix code 25 from the structured data Ds. The generation unit 17 is for example able to generate a two-dimensional matrix code 25 for each second frame of structured data.

In the described exemplary embodiment, the encoding unit 16 and the generation unit 17 are achieved as pieces of software able to be stored in a memory, not shown, and to be executed by a processor, not shown, associated with the memory, the processor and a memory forming an information processing unit included in the measurement device 10.

Alternatively, the encoding unit 16 and the generation unit 17 are achieved as programmable logic components, or further as dedicated integrated circuits, included in the measurement device 10.

The display unit 18 is able to display each generated matrix code 25. The display unit 18 for example includes a screen 26, visible in FIG. 5, able to display the matrix code 25 of a predefined size.

The reading unit 19, visible in FIG. 3, is able to read each displayed matrix code 25 and determine the structured data Ds corresponding to the read matrix code 25. The reading unit 19 is then able to transmit said frame of structured data Ds to the decoding unit 20.

The decoding unit 20 is able to receive the frame of structured data Ds transmitted by the reading unit 19. The decoding unit 20 is able to retrieve a descriptor D of the structuration format F corresponding to the first identifier 22.

The decoding unit 20 is for example connected to a computer network, such as the Internet network, allowing it to communicate with a computer server, such as a Web server, containing the descriptor D of the structuration format F corresponding to the first identifier 22. The first identifier 22 is for example an Internet link to a file contained in the server, or is part of such a link.

Alternatively, the detailing unit 20 includes a memory, not shown, in which is contained the descriptor D of the structuration format F corresponding to the first identifier 22.

The decoding unit 20 is able to use the descriptor D for determining the frame of measurement data Dm contained in each frame of structured data Ds.

Additionally, the decoding unit 20 is able to transmit the frame of the measurement data Dm, decoded from the data read by the reading unit 19, to the remote electronic apparatus 21.

In the described exemplary embodiment, the reading unit 19 and the decoding unit 20 are at least partly achieved as pieces of software able to be stored in a memory, not shown, and to be executed by a processor, not shown, associated with a memory, the processor and the memory forming an information processing unit included in the electronic reader 14.

Alternatively, the reading unit 19 and the decoding unit 20 are at least partly achieved as programmable logic components, or further as dedicated integrated circuits, included in the electronic reader 14.

The measurement device 10 is then preferably able to transmit each of the second frames of structured data Ds as matrix codes 25 to the electronic reader 14. The electronic reader 14 is then able to transmit, to the remote electronic apparatus 21, each of the frames of measurement data Dm, from the second frames of structured data Ds decoded by the decoding unit 20 depending on the first identifier 22 contained in the structured data Ds, the second frames of structured data Ds being themselves obtained by the reading unit 19 from read matrix codes 25, the latter being displayed on the screen 26 of the measurement device.

The electronic apparatus 21 for example comprises a second screen 28 and is able to receive information from the reader 14, in particular from the decoding unit 20. The electronic apparatus 21 is able to at least partly display the pieces of information from the reader 14, and in a form which may be understood by an operator.

The first identifier 22, visible in FIG. 4, is a single number for each structuration format F, and allowing exclusive identification of the associated structuration format F. For example, this is a key indicating the format used by the measurement device 10 transmitting the frame of structured data Ds as the matrix code 25. The first identifier 22 is preferably expressed as a hexadecimal or decimal number.

The second identifier 23 is a single number for each second frame of structured data Ds. The second identifier 23 is able to identify the second frame which is associated with it from among second frames of structured data Ds. The second identifier 23 is also called a sequence number.

The second identifier 23 is preferably a decimal number, and preferably included in the header of each frame of structured data Ds.

As an example, the second identifier 23 is a counter which is incremented by the encoding unit 16 at each received new first frame of measurement data Dm. In this case, the second identifier 23 of the second initial frame of structured data Ds, i.e. of the second frame placed in a first position in the sequence of second frames will have the value 1. The second identifier 22 of the second following frame of structured data Ds, i.e. of the second frame placed in a second position in the sequence of second frames, will have the value 2 and so forth. The second identifier 23 is then unique for each second frame of structured data Ds from among the plurality of second frames.

The field of formatted data 24 is determined by the encoding unit 16, from a second frame of measurement data Dm and from the structuration format F.

Figure 5:
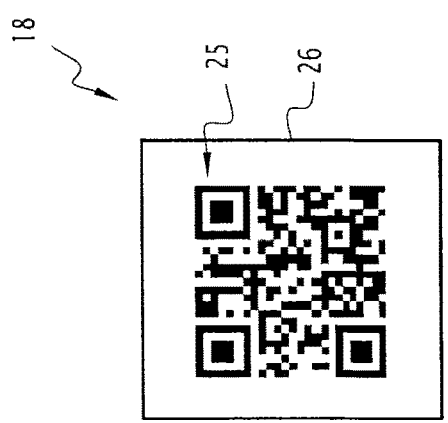
FIG. 5 is a view of a matrix code displayed by a display unit of the measurement device of FIG. 1.

Each two-dimensional matrix code 25, visible in FIG. 5, which is displayed by the screen 26 of the display unit 18 corresponds to a single second frame of structured data Ds.

Each two-dimensional matrix code 25 is for example a QR (Quick Response) code. The code of the QR type has the advantages of containing more information than a conventional barcode.

The two-dimensional matrix code 25 for example consists of black and white squares, which correspond to the FIGS. 0 and 1 respectively. Each square in this case contains a bit of information.

The structuration format F determines the truncation of the frame of measurement data Dm, the number of figures before and after the decimal point if it is a decimal number, as well as optionally another parameter defining the format of the associated number, these pieces of information being contained in a descriptor D.

The descriptor D of the structuration format F is for example in the form of a file with an XML (Extensible Markup Language) format or JSON (JavaScript Object Notation) format, or any other descriptive language.

The descriptor D comprises pieces of information representative of the frame of measurement data Dm. The descriptor for example contains the length of the frame of measurement data Dm, if there is a truncation, and other pieces of information specific to the frame of measurement data Dm which are useful to be transmitted to the reader.

Additionally, the descriptor D of the structuration format F comprises pieces of information representative of the nature of the quantity 12 measured by the device 10, as such as a title and a description of the measured quantity, of the manufacturer of the device 10, of its date of manufacture and other pieces of information specific to the device 10.

Still additionally, the descriptor D of the structuration format F comprises a parameter indicating the visibility or not of the corresponding frame. This parameter then only allows display of the information relating to certain measurements carried out from among the whole of the measurements carried out.

For example, the measurement unit 15 of the device 10 is an ammeter which measures a value of 2.3456 amperes. The measurement unit 15 provides a frame of measurement data Dm containing in an encrypted form 2.3456. The field of formatted data 24 is for example expressed by the number 23456. In this case, the value measured by the device 10, is again found by introducing a point after the first figure of the number contained in the frame of measured data Dm.

In the previous example, the descriptor D contains the piece of information that the field of formatted data 24 contains a number which has a figure before the point and four figures after the point, and that it represents an electric intensity. In this case, the decoding unit 20 is able to again find that the value contained in the frame of measurement data Dm is 2.3456, and able to transmit this value to the remote electronic apparatus 21.

The decoding unit 20 is able to transmit, to the remote electronic apparatus 21, the measurement data Dm, the descriptor D of the structuration format F corresponding to the first identifier 22, and optionally the second identifier 23. The electronic apparatus 21 is then able to receive the measurement data Dm, the descriptor D of the format corresponding to the first identifier 22, as well as optionally the second identifier 23 when the received measurement data Dm correspond to a second respective frame from among a plurality of second frames.

Again considering the previous example, the second screen 28 displays «Intensite mesurée=2.34 ampères» (Measured intensity=2.34 A). The operator reading the data on the second screen 28 is then capable of knowing the frames of measurement data Dm which correspond to the values measured by the measurement device 10.

The second screen 28 is also able to display the second identifier 23, for example as «Numéro de la trame de données=40» (No. of the data frame=40), if this is the second identifier 23 associated with the fortieth frame of structured data Ds.

Additionally, the second screen 28 is able to display information contained in the descriptor D.

Figure 6:
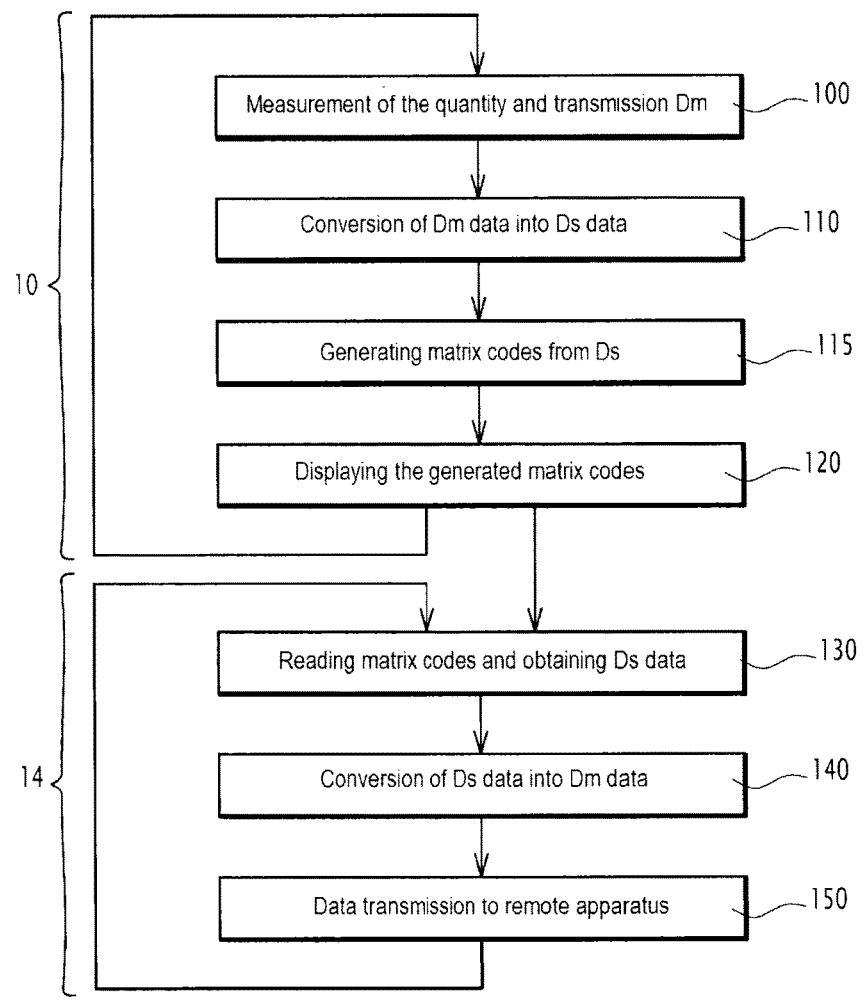
FIG. 6 is a flowchart of a data transmission method according to the invention.

The operation of the electronic installation 8, of the measurement device 10 and of the electronic reader 14 will be described in more detail by means of FIG. 6 illustrating a flowchart of the transmission method according to the invention.

During an initial step 100, the measurement unit 15 of the device 10 measures the quantity 12 and periodically delivers first frames of measurement data Dm. It then transmits the frames of measurement data Dm, one off to the other, to the encoding unit 16.

During step 110, the encoding unit 16 converts the first frames of measurement data Dm one after the other into second frames of structured data Ds, the structured data Ds being according to the structuration format F. It then transmits one after the other each of the frames of structured data Ds to the generation unit 17.

According to the invention, the structured data Ds contain the first identifier 22 of the structuration format F, said first identifier 22 being able to exclusively identify the structuration format.

Each second frame of structured data Ds preferably contains the first identifier 22 characteristic of the structuration format F, the second identifier 23 characteristic of the corresponding second frame, and the field 24 of data formatted according to the structuration format F.

The generation unit 17 then generates, during a following step 115, a two-dimensional matrix code 25 for each second frame of structured data Ds.

During a step 120, the display unit 18 successively displays, on its screen 26, each of the two-dimensional matrix codes 25 generated by the generation unit 17. The screen 26 displays a succession of two-dimensional matrix codes 25 corresponding to a succession of second frames of structured data Ds.

During a step 130, the reading unit 19 of the electronic reader 14 reads each of the two-dimensional matrix codes 25 displayed on the screen 26 of the display unit of the measurement device 10, and infers therefrom each of the second frames of structured data Ds. The reading unit 19 then transmits these frames of structured data Ds, preferably as numbers, to the decoding unit 20.

During a step 140, the decoding unit 20 receives the frame of structured data Ds transmitted by the reading unit 19. The decoding unit 20 retrieves the descriptor D which corresponds to the first identifier 22 of the structuration format F and uses this descriptor D for determining the frame of measurement data Dm contained in the frame of structured data Ds.

The decoding unit 20 then extracts each first frame of measurement data Dm contained in frames of structured data Ds.

The decoding unit 20 during step 150 transmits to the remote electronic apparatus 21, the measurement data Dm, the second identifier 23 and the descriptor D corresponding to the first identifier 22.

The second screen 28 of the remote electronic apparatus 21 then receives the measurement data Dm, the descriptor D of the format corresponding to the first identifier 22, as well as optionally the second identifier 23, and displays the data according to a form which may be understood by an operator.

The electronic installation 8 according to the invention then allows the use of any measurement device 10 according to the invention with any electronic reader 14 according to the invention.

The fact that the measurement device 10 transmits to the reader 14 via the first identifier 22 a unique indicator of the structuration format F used allows the measurement reader 14 to retrieve a descriptor D of said format used and to be then able to read the fields of a formatted data 24. In other words, the measurement reader 14 and the measurement device 10 are, according to the invention, able to share the information measured from an identifier, i.e. the first identifier 22 suitable for exclusively identifying the structuration format F.

The measurement device 10 is then easier to use and it may be used with a larger number of compatible matrix code readers 16.

As the measurement device 10 and the measurement reader 14 evolve at different rates (for example according to software upgrades), an additional advantage of the invention is to allow reading/decoding compatibility which is permanent over time.

According to an alternative embodiment, the screen 26 of the display unit 18 of the device 10 is able to simultaneously display a number N of two-dimensional matrix codes 25, N being strictly greater than 1.

The electronic reader 14 is also able to simultaneously read the number N of two-dimensional matrix codes 25.

The generation unit 17 then generates matrix codes 25 for the frames of structured data Ds stemming one after the other from the encoding unit 16, and stores the different generated matrix codes 25.

Once the number of matrix codes 25 stored in the generation unit 17 is equal to the number N, the generation unit 17 transfers the generated matrix codes 25 to the display unit 18 so that the N matrix codes 25 are displayed on the screen 26 simultaneously.

The electronic reader 14 reads the N matrix codes, and the reading unit 19 then infers therefrom the associated frames of structured data Ds and transmits them to the decoding unit 20 which stores them.

Each of the frames of structured data Ds stored in the decoding unit 20 is then converted into measurement data by the decoding unit, in a similar way to what was described earlier.

This alternative embodiment then allows an increase in the throughput of the transmission of information between the measurement device 10 and the electronic reader 14.

The invention claimed is:

1. An electronic device for measuring a variable, comprising:
an electronic circuit configured to:
measure the variable to deliver measurement data,
perform an encoding operation to convert the measurement data into structured data according to a structuration format, the data structured according to the structuration format including at least one portion of the measurement data, generate at least one two-dimensional matrix code from the structured data, and control display of each generated two-dimensional matrix code, wherein the structured data further includes a first identifier of the structuration format, said first identifier being to exclusively identify in a unique way the structuration format for a plurality of different electronic readers, including a first electronic reader, to read the measurement data converted into the structured data, wherein the measurement data include successive first frames of measurement data, wherein the electronic circuit is configured to convert each said first frame of measurement data into a corresponding second frame of structured data, each said second frame including a second identifier of said frame from among the plurality of second frames, wherein the first identifier and the second identifier are distinct from each other, wherein the structured data consists of alphanumerical characters, and wherein the structuration format determines a truncation of each said first frame of measurement data.

2. The electronic device according to claim 1, wherein the structuration format is defined by a descriptor in the form of a file with an XML or BON format.

3. The electronic device according to claim 1, wherein the variable is an electric variable.

4. The electronic device according to claim 1, wherein the variable is a thermodynamic variable.

5. An electronic reader comprising reading circuitry configured to read the at least one two-dimensional matrix code, the at least one two-dimensional matrix code being able to be displayed by the electronic device according to claim 1, the reading circuitry further being configured to determine the structured data corresponding to the at least one two-dimensional matrix code read, wherein the electronic reader further comprises decoding circuitry configured to determine, depending on the first identifier, the measurement data contained in the structured data, and wherein the electronic reader is one of said plurality of electronic readers.

6. The electronic reader according to claim 5, wherein the decoding circuitry is configured to retrieve a descriptor of the structuration format corresponding to the first identifier of the structuration format, and to use said descriptor to determine the measurement data contained in the structured data.

7. The electronic reader according to claim 6, wherein the decoding circuitry is configured to retrieve the descriptor of the structuration format from a computer server via an Internet network.

8. The electronic reader according to claim 6, wherein the decoding circuitry is configured to transmit, to an electronic apparatus external to the electronic reader, the measurement data contained in the structured data and the descriptor of the format corresponding to the first identifier.

9. An electronic installation for measuring the variable, wherein the electronic installation comprises the electronic reader according to claim 5.

10. The installation according to claim 9, wherein the variable is an electric variable.

11. The installation according to claim 9, wherein the variable is a thermodynamic variable.

12. The electronic device according to claim 1,
wherein the measurement data correspond to a decimal number, and
wherein the structuration format determines a number of figures before and after a decimal point of the decimal number.

13. A method for transmitting measurement data of a variable between an electronic device configured to measure the variable and an electronic reader, the method comprising:

encoding measurement data, during which measurement data are converted, by the electronic device, into data structured according to a structuration format, the data structured according to the structuration format including at least one portion of the measurement data, generating, by the electronic device, at least one two-dimensional matrix code from the structured data, displaying, by the electronic device, each said generated at least one two-dimensional matrix code, reading, by the electronic reader, the displayed matrix code(s) at least one two-dimensional matrix code, and determining, by the electronic reader, measurement data contained in the structured data, wherein the structured data includes a first identifier of the structuration format, the first identifier being to exclusively identify the structuration format, for a plurality of different electronic readers, including said electronic reader, to read the measurement data converted into the structured data, wherein said first identifier is used in said determining the measurement data contained in the structured data, wherein the measurement data include successive first frames of measurement data, wherein the method further comprises converting each said first frame of measurement data into a corresponding second frame of structured data, each said second frame including a second identifier of said frame from among the plurality of second frames, wherein the first identifier and the second identifier are distinct from each other, wherein the structured data consists of alphanumerical characters, and wherein the structuration format determines a truncation of each said first frame of measurement data.

14. The method according to claim 13, wherein, during said determining the measurement data contained in the structured data, the electronic reader retrieves a descriptor of the structuration format corresponding to the first identifier, and uses said descriptor to determine the measurement data contained in the structured data.

15. The method according to claim 13, wherein the variable is an electric variable.

16. The method according to claim 13, wherein the variable is a thermodynamic variable.

17. The method according to claim 13,
wherein the measurement data correspond to a decimal number, and
wherein the structuration format determines a number of figures before and after a decimal point of the decimal number.

* * * * *